(12) United States Patent
Suzuki et al.

(10) Patent No.: US 11,260,418 B2
(45) Date of Patent: Mar. 1, 2022

(54) METHOD FOR MANUFACTURING TARGET OBJECT COATED WITH COATING SUBSTANCE

(71) Applicant: ORIGIN COMPANY, LIMITED, Saitama (JP)

(72) Inventors: Takayuki Suzuki, Saitama (JP); Tatsuo Okubo, Saitama (JP); Naoto Ozawa, Saitama (JP)

(73) Assignee: ORIGIN COMPANY, LIMITED, Saitama (JP)

( * ) Notice: Subject to any disclaimer, the term of this patent is extended or adjusted under 35 U.S.C. 154(b) by 0 days.

(21) Appl. No.: 17/269,249

(22) PCT Filed: Aug. 19, 2019

(86) PCT No.: PCT/JP2019/032237
§ 371 (c)(1),
(2) Date: Feb. 17, 2021

(87) PCT Pub. No.: WO2020/040076
PCT Pub. Date: Feb. 27, 2020

(65) Prior Publication Data
US 2021/0245194 A1 Aug. 12, 2021

(30) Foreign Application Priority Data
Aug. 22, 2018 (JP) .............................. JP2018-155847

(51) Int. Cl.
*B05D 1/00* (2006.01)
*B05D 7/24* (2006.01)

(52) U.S. Cl.
CPC ............... *B05D 1/005* (2013.01); *B05D 7/24* (2013.01)

(58) Field of Classification Search
None
See application file for complete search history.

(56) References Cited

U.S. PATENT DOCUMENTS

2014/0272704 A1 9/2014 Chang et al.

FOREIGN PATENT DOCUMENTS

| CN | 1386588 A | 12/2002 |
|---|---|---|
| CN | 103298566 A | 9/2013 |

(Continued)

OTHER PUBLICATIONS

Machine Translation of CN 105390405 A (Year: 2016).*

(Continued)

*Primary Examiner* — Duy Vu N Deo
*Assistant Examiner* — Bradford M Gates
(74) *Attorney, Agent, or Firm* — Squire Patton Boggs (US) LLP (57) ABSTRACT

A method for manufacturing a target object coated with a coating substance, whose edge face portions and flat face portion can be covered with the coating substance with a predetermined thickness, is provided. The target object T includes a flat face portion Tf and an edge face portion Te continuous from the portion Tf which includes a coating flat surface Tsp formed thereon which has a flat face. The portion Te includes a coating edge surface Tsc which includes at least one of a curved surface or a flat surface that is not parallel to the surface Tsp. The method includes a coating substance supply step of supplying the substance R along at least the surface Tsp, and an edge face portion coating substance adjustment step of adjusting the substance R supplied to the surface Tsc or moved from the surface Tsp to cover the surface Tsc at a predetermined thickness.

10 Claims, 6 Drawing Sheets

(56) References Cited

FOREIGN PATENT DOCUMENTS

| CN | 105390405 A | 3/2016 |
|---|---|---|
| JP | S 59206081 A | 11/1984 |
| JP | H 8071503 A | 3/1996 |
| JP | 2009015923 A | 1/2009 |
| JP | 2016175070 A | 10/2016 |
| WO | WO 2012/124253 A1 | 9/2012 |

OTHER PUBLICATIONS

Notice of Opinion of First Examination dated Oct. 12, 2020 issued for Chinese Patent Application No. 201980005211.5, with English translation, 11 pages.

Office Action dated Mar. 18, 2021 for Chinese Patent Application No. 201980005211.5, with English translation, 10 pages.

International Search Report dated Sep. 10, 2019 for International Application No. PCT/JP2019/032237, with English translation, 5 pages.

Notification of Reason for Refusal dated Sep. 1, 2020 issued for Korean Patent Application No. 10-2020-7012175, with English translation, 10 pages.

\* cited by examiner

METHOD FOR MANUFACTURING TARGET OBJECT COATED WITH COATING SUBSTANCE

CROSS-REFERENCE

This application is a National Stage filing under 35 U.S.C. § 371 of International Patent Application No. PCT/JP2019/032237, filed Aug. 19, 2019, which claims the benefit of priority to JP Application No. 2018-155847, filed Aug. 22, 2018, both applications which are incorporated herein by reference in their entirety for all purposes.

TECHNICAL FIELD

The present invention relates to a method for manufacturing a target object coated with a coating substance, and, in particular, to a method for manufacturing a target object coated with a coating substance, whose edge face portions as well as flat face portion can be covered with a coating substance with a predetermined thickness.

BACKGROUND ART

As a technique for forming a resin film with a uniform thickness on a substrate such as an optical disc, there is a spin-coating method. The spin-coating method forms a resin film by supplying a resin liquid as a raw material for a resin film to a center of a surface of a substrate and then rotating the substrate about an axis of rotation being vertical to the surface of the substrate and passing through the center of the surface of the substrate to spread the resin liquid over the entire surface (see Patent Document 1, for example).

RELATED ART DOCUMENT

Patent Document

Patent Document 1: JP2009-15923A

SUMMARY OF THE INVENTION

Problem to be Solved by the Invention

Coating target objects, which are targets to be coated with a coating substance such as a resin liquid, include those (for example, protective glass or the like) other than substrates such as optical discs, and some of them have a shape a major portion of which is occupied by a flat face portion having a flat surface formed thereon with edges of the flat face portion chamfered into curved surfaces or the like. Then, when a coating substance is applied to such a coating target object, it is sometimes required to apply the coating substance at a predetermined thickness to the chamfered edge portions as well as the flat face portion. However, in the spin-coating method described in Patent Document 1, it is difficult to make the coating substance applied to the chamfered edge portions to a predetermined thickness.

In view of the above problem, it is an object of the present invention to provide a method for manufacturing a target object coated with a coating substance, whose edge face portions and flat face portion can be covered with a coating substance with a predetermined thickness.

Means for Solving the Problem

To achieve the above object, a method for manufacturing a target object coated with a coating substance according to a first aspect of the present invention is, as illustrated with reference to FIGS. 1A to 3, for example, a method for manufacturing a target object T coated with a coating substance, the target object T including a flat face portion Tf and an edge face portion Te continuous from the flat face portion Tf, the flat face portion Tf including a coating flat surface Tsp (see FIG. 2B) formed thereon which has a flat face, the edge face portion Te including a coating edge surface Tsc (see FIG. 2B) formed thereon, the coating edge surface Tsc including at least one of a curved surface or a flat surface that is not parallel to the coating flat surface Tsp of the flat face portion Tf, and a coating substance R being coated on the coating flat surface Tsp and the coating edge surface Tsc, the method comprising: a coating substance supply step (S2) of supplying the coating substance R along at least the coating flat surface Tsp; and an edge face portion coating substance adjustment step (S3 to S5) of adjusting the coating substance R supplied to the coating edge surface Tsc, or the coating substance R, which is moved from the coating flat surface Tsp, to cover the coating edge surface Tsc at a predetermined thickness.

This configuration makes it possible to cover the edge face portions as well as the flat face portion with a coating substance with a predetermined thickness.

Figure 1A:
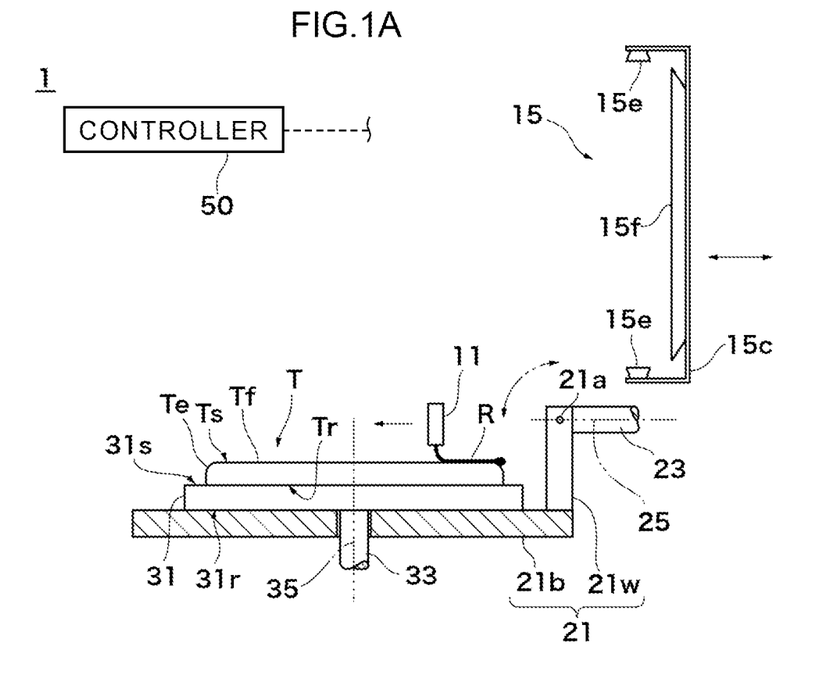
FIGS. 1A and 1B are schematic configuration diagrams of a coating apparatus as an example of an apparatus for implementing a method for manufacturing a target object coated with a coating substance according to an embodiment of the present invention.
Figure 1B:
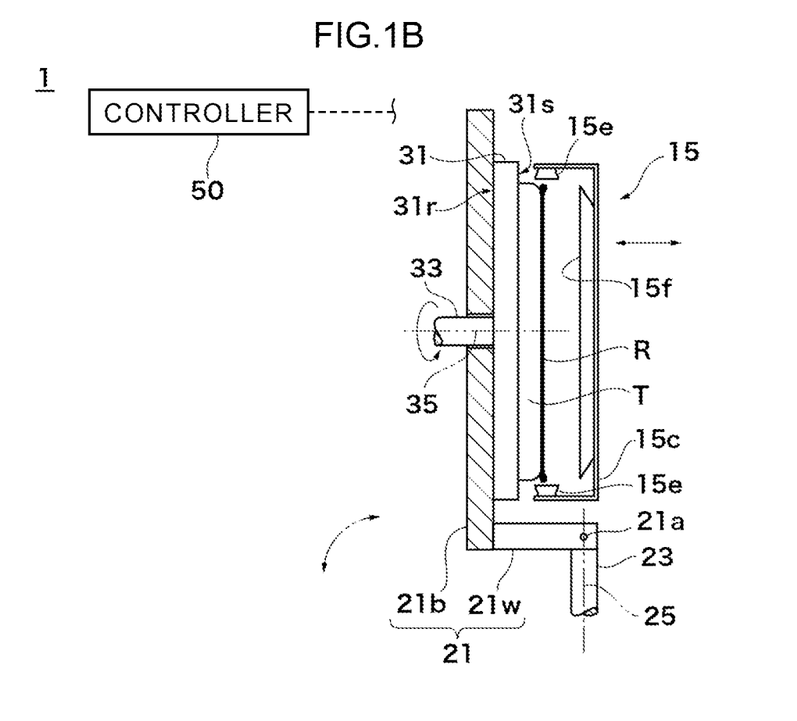
Figure 3:
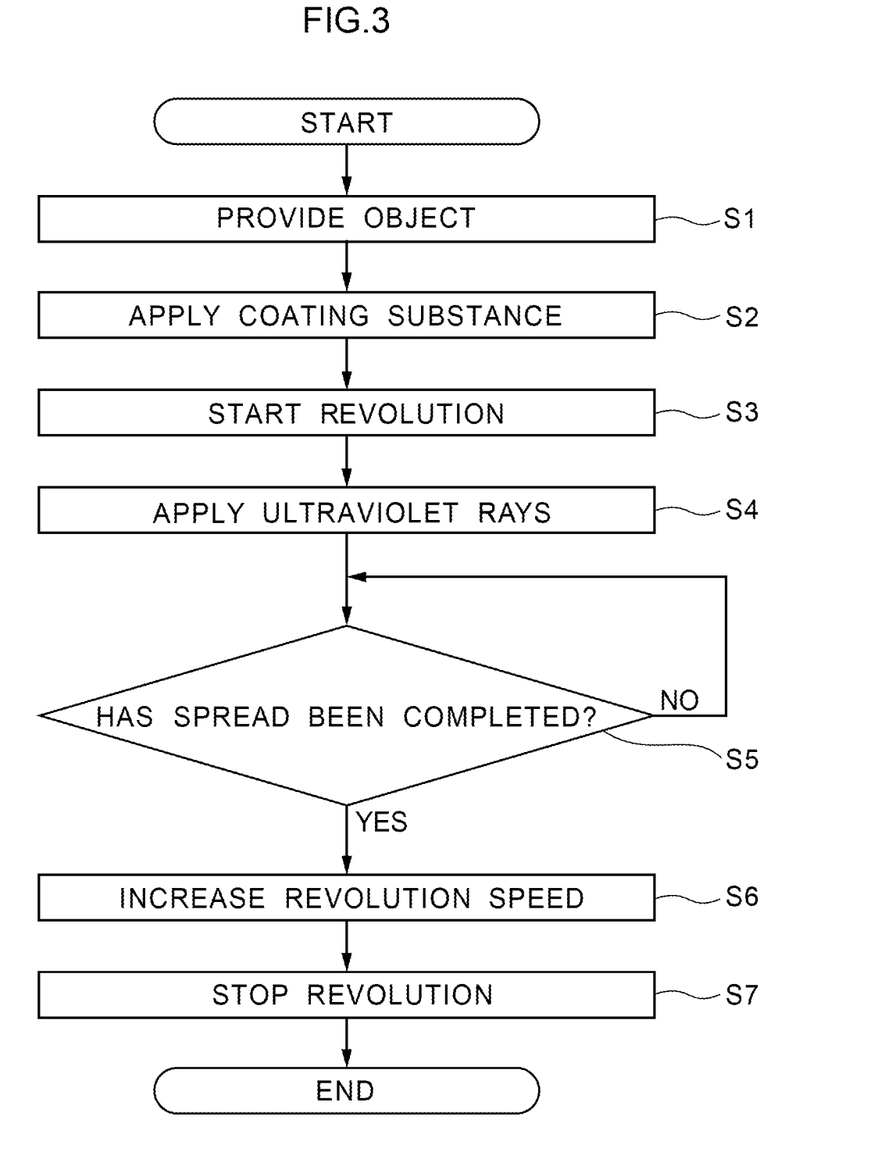
FIG. 3 is a flowchart, showing a procedure for manufacturing a coated object.

As for the method for manufacturing the target object coated with a coating substance according to a second aspect of the present invention, as shown in FIGS. 1B and 3, for example, in the method for manufacturing the target object coated with a coating substance according to the first aspect, the edge face portion coating substance adjustment step (S3 to S5) comprises spreading the coating substance R by revolving the target object T about a revolution axis 25.

This configuration allows the coating substance to be applied almost uniformly to the edge face portions by a centrifugal force generated by revolution about the revolution axis.

Figure 2A:
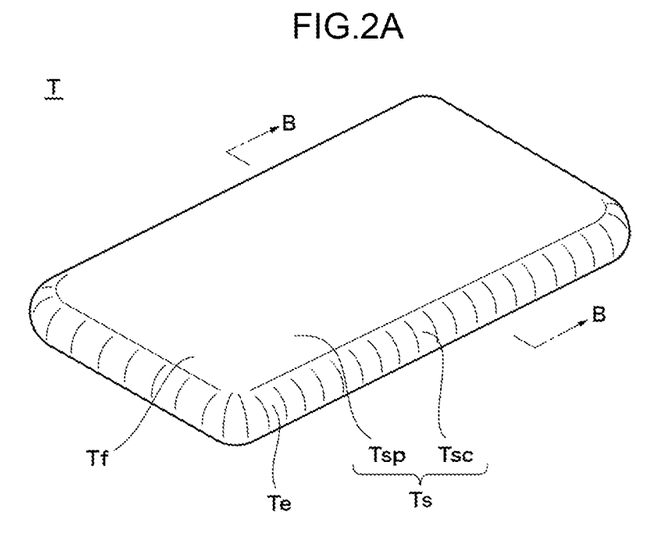
FIG. 2A is a perspective view and FIG. 2B is a vertical cross-sectional view, showing an object to be applied in an embodiment of the present invention.
Figure 2B:
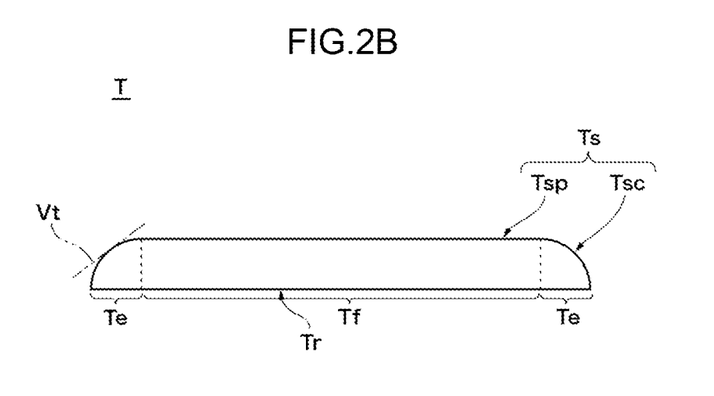

As for the method for manufacturing the target object coated with a coating substance according to a third aspect of the present invention, as shown in FIG. 1B, for example, in the method for manufacturing the target object coated with a coating substance according to the second aspect, the revolution axis 25 is an axis of revolution about which the target object T is revolved to generate a centrifugal force that moves the coating substance R in a direction away from the coating flat surface Tsp (see FIGS. 2A and 2B, for example) along the coating edge surface Tsc (see FIGS. 2A and 2B, for example).

This configuration makes it possible to form a film of the coating substance continuing smoothly from the coating flat surface to the coating edge surfaces.

As for the method for manufacturing the target object coated with a coating substance according to a fourth aspect of the present invention, as shown in FIGS. 1A, 1B, 2A, 2B and 5, for example, in the method for manufacturing the target object coated with a coating substance according to the third aspect, the method further comprising, before the edge face portion coating substance adjustment step, a jig attachment step of attaching a jig 19 to the target object T on a downstream side of the direction in which the coating substance R is moved by the centrifugal force with respect to the coating flat surface Tsp, the jig 19 including a connecting face 19f that forms a surface continuous from the coating edge surface Tsc when attached to the target object T; wherein the edge face portion coating substance adjustment step further comprises spreading the coating substance R until the coating substance reaches the connecting face 19f beyond the coating edge surface Tsc by revolution of the target object T about the revolution axis 25.

This configuration makes it possible to cover the entire edge face portions with the coating substance with a predetermined thickness.

As for the method for manufacturing the target object coated with a coating substance according to a fifth aspect of the present invention, as shown in FIGS. 1A, 1B and 3 for example, in the method for manufacturing the target object coated with a coating substance according to any one of the second aspect to the fourth aspect, the coating substance R comprises a liquid substance that increases in viscosity when subjected to a predetermined viscosity increasing treatment; and the edge face portion coating substance adjustment step (S3 to S5) further comprises a viscosity increasing step (S4) of subjecting the coating substance R, which has been adjusted to the predetermined thickness, to the predetermined viscosity increasing treatment.

This configuration makes it possible to dispose of excess coating substance while the coating substance on the edge face portions is maintained at a predetermined thickness.

Figure 6A:
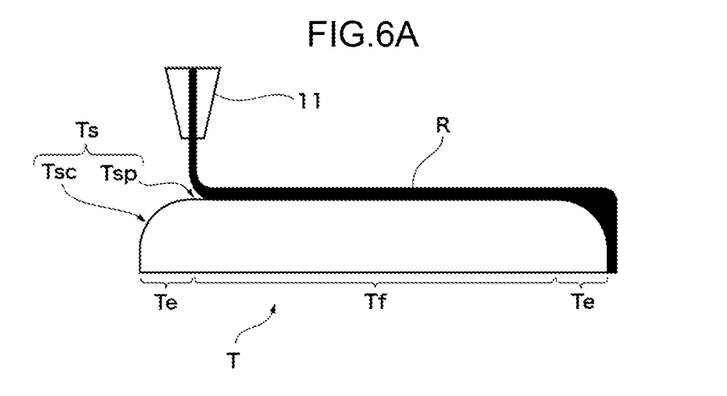
FIGS. 6A to 6C are side elevational views of a conceptual diagram, showing an example of an aspect of a implementing a method for manufacturing a target object coated with a coating substance according to a second modification of the embodiment of the present invention.
Figure 6B:
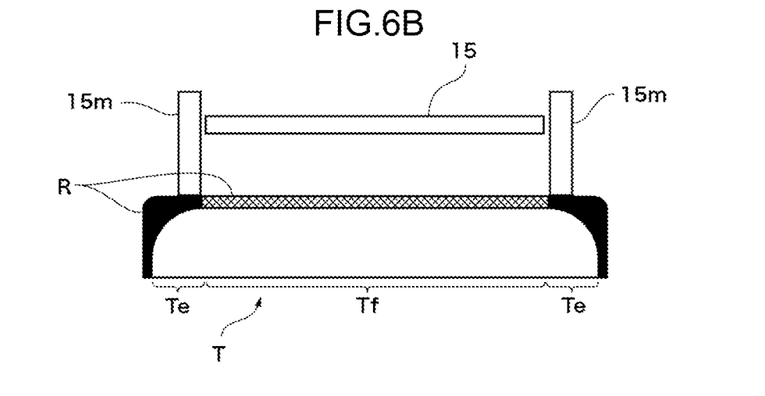
Figure 6C:
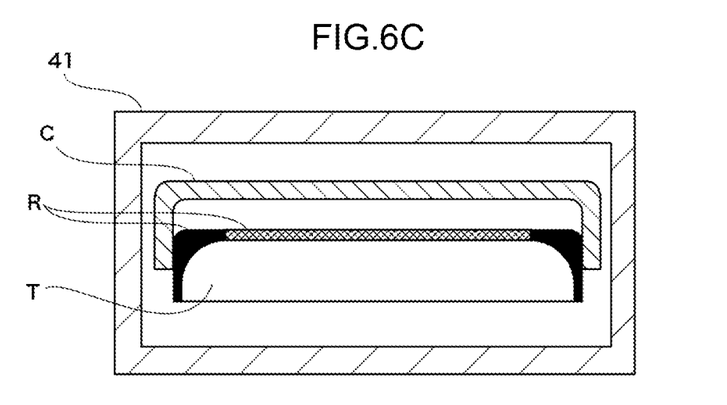

As for the method for manufacturing the target object coated with a coating substance according to a sixth aspect of the present invention, as shown in FIGS. 6A to 6C, for example, in the method for manufacturing the target object coated with a coating substance according to the first aspect, the edge face portion coating substance adjustment step comprises fitting an overlay member C, for covering the coating flat surface Tsp and the coating edge surface Tsc, onto the target object T to adjust the coating substance R filled between the target object T and the overlay member C to a predetermined thickness.

This configuration makes it possible to stick the target object and the overlay member to each other via the coating substance with a predetermined thickness.

Advantageous Effect of the Invention

According to the present invention, it makes possible to cover the edge face portions as well as the flat face portion with a coating substance with a predetermined thickness.

DESCRIPTION OF EMBODIMENTS

This application is based on the Patent Application No. 2018-155847 filed on Aug. 22, 2018 in Japan, the contents of which are hereby incorporated in its entirety by reference into the present application, as part thereof.

The present invention will become more fully understood from the detailed description given hereinbelow. Further range of application of the present invention will become clearer from the detailed description given hereinbelow. However, the detailed description and the specific embodiment are illustrated of desired embodiments of the present invention and are described only for the purpose of explanation. Various changes and modifications will be apparent to those ordinary skilled in the art on the basis of the detailed description.

The applicant has no intention to give to public any disclosed embodiment. Among the changes and modifications, those which may not literally fall within the scope of the patent claims constitute, therefore, a part of the present invention in the sense of doctrine of equivalents.

Description will hereinafter be made of an embodiment of the present invention with reference to the drawings. The same or corresponding members are denoted with the same reference numerals in all the drawings, and their descriptions are not repeated.

Referring first to FIGS. 1A and 1B, a coating apparatus 1 for implementing a method for manufacturing a target object coated with a coating substance according to an embodiment of the present invention will be described. FIG. 1A is a schematic configuration diagram of a coating apparatus 1, showing an exemplary aspect when a coating substance R is applied and FIG. 1B is a schematic configuration diagram of a coating apparatus 1, showing an exemplary aspect when the coating substance R is spread. The coating apparatus 1 is an apparatus suitable for covering a flat face portion Tf that constitutes a main surface of a target object T (which is hereinafter referred to simply as "object T") to be coated with the coating substance R and edge face portions Te that constitute edge portions thereof with the coating substance R with a predetermined thickness. The coating apparatus 1 includes a coating device 11, an ultraviolet (UV) irradiator 15, a revolution plate 21, a rotation plate 31, and a controller 50. Prior to describing the coating apparatus 1, the object T, which is to be coated with the coating substance R in this embodiment, is described.

FIG. 2A is a perspective view of the object T, and FIG. 2B is a vertical cross-sectional view of the object T as seen in the direction of the arrows B-B of FIG. 2A. In this embodiment, the object T is formed to have a plate-like shape that is rectangular in a plan view and has a thickness as a whole. Here, for the convenience of description, the object T is imaginarily divided into the flat face portion Tf, which is a main portion, and the edge face portions Te, which are edge portions. The flat face portion Tf has a surface that is to be coated with the coating substance R and that is formed of a flat surface, and this flat surface is referred to as coating flat surface Tsp. The edge face portions Te include coating edge surfaces Tsc that are to be coated with the coating substance R and that are continuous from the coating flat surface Tsp but are not on the same plane as the coating flat surface Tsp.

The coating edge surfaces Tsc are typically formed of a curved surface, a flat surface that is not parallel to the coating flat surface Tsp, or a combination of these. In other words, the object T has a coating surface Ts that is chamfered at the edge face portions Te. The coating surface Ts is a surface to be coated with the coating substance R, and includes the coating flat surface Tsp and the coating edge surfaces Tsc. It should be noted that the curved surface forming the coating edge surfaces Tsc may or may not have a constant curvature as long as a tangent plane Vt (which is a virtual plane tangent to a curved surface and formed by a tangent line to an arbitrary curve on the curved surface) is not on the same plane as the coating flat surface Tsp. The curved surface forming the coating edge surfaces Tsc may have as small a radius of curvature as about 1 mm or 0.5 mm or may have a radius of curvature of about 5 mm or 10 mm. While the object T has a reverse face Tr formed as a flat surface that is parallel to the coating flat surface Tsp on the side opposite the coating flat surface Tsp in this embodiment, it may be formed as a flat surface that is not parallel to the coating flat surface Tsp or may not be a flat surface.

The coating substance R that is to be applied to the coating surface Ts is a liquid substance having a predetermined viscosity, and can be used in applications such as coating agents, adhesives and so on. The coating substance R is typically suitable for wet coating. The predetermined viscosity is determined according to the usage of the coating substance R, and is typically a viscosity that allows the coating substance R to be deformed to spread when a centrifugal force is exerted thereon. Also, in this embodiment, the coating substance R has a property of increasing in viscosity when irradiated with ultraviolet rays. In addition, the coating substance R is configured to lose flowability and turn gelatinous with an increase in viscosity. In the following description, reference is made to FIGS. 2A and 2B as appropriate when mention is made to the configuration of the object T.

Referring again to FIGS. 1A and 1B, description of the coating apparatus 1 will be continued. The coating device 11 supplies the coating substance R to the coating surface Ts. In other words, the coating device 11 functions as a coating substance supply portion in the coating apparatus 1. In this embodiment, the coating device 11 is configured to be able to apply the coating substance R uniformly to the coating flat surface Tsp, and an applicator, bar coater, die coater, slit coater or the like can be used therefor. In some situations, the coating device 11 may spray the coating substance R. The coating device 11 is configured to be movable along the coating flat surface Tsp, and, in this embodiment, is configured to be movable horizontally.

The UV irradiator 15 emits ultraviolet rays, and functions as a viscosity increasing treatment portion in the coating apparatus 1. In this embodiment, the UV irradiator 15 has a main portion 15$f$ and end portions 15$e$. In this embodiment, the main portion 15$f$ and the end portions 15$e$ are attached to a rectangular parallelepiped box member 15$c$ with a U-shaped cross-section having an open side. The main portion 15$f$ is attached to an inner bottom face of the box member 15$c$. The end portions 15$e$ are attached to lateral sides extending vertically from the inner bottom face of the box member 15$c$. The main portion 15$f$ and the end portions 15$e$ are attached to the box member 15$c$ in such an arrangement that the end portions 15$e$ are located at positions facing the coating edge surfaces Tsc when the object T is placed with the coating flat surface Tsp facing the main portion 15$f$. The UV irradiator 15 is configured to be able to adjust the intensity of ultraviolet rays to be emitted. Also, the UV irradiator 15 configured to be movable so that the distance to the object T can be changed, and, in this embodiment, is configured to be movable horizontally. Since the UV irradiator 15 is configured to be movable horizontally, the range of ultraviolet rays to be applied to the coating edge surface Tsc can be changed. It should be noted that, as a configuration to change the range of ultraviolet rays to be applied to the coating edge surfaces Tsc, a configuration in which the range that is irradiated with the ultraviolet rays from the UV irradiator 15 is limited by a masking, a configuration in which the UV irradiator 15 is constituted of a movable UV laser so that the ultraviolet rays can be applied only to a designated position, or a configuration in which a mirror is used to control UV light is also possible instead of the configuration in which the main portion 15$f$ and the end portions 15$e$ are attached to the movable box member 15$c$.

The revolution plate 21 is a member for allocating the object T when the coating substance R is applied to the object T. The revolution plate 21 is formed of a plate-like member. The revolution plate 21 has a bottom portion 21$b$ formed to have a size that encompasses the reverse face Tr of the object T, and a wall portion 21$w$ extending vertically upward from an end of the bottom portion 21$b$. The face of the bottom portion 21$b$ on which the object T is placed via the rotation plate 31 is formed to be a flat face. A revolution shaft 23 is attached to an end portion of the wall portion 21$w$ on the side opposite an end portion connected to the bottom portion 21$b$. The revolution shaft 23 is a rod-like member, and is typically attached to the wall portion 21$w$ to extend parallel to a surface of the bottom portion 21$b$ to the opposite side from where the bottom portion 21$b$ is situated. A solid or hollow cylinder or prismatic column with a polygonal cross-section can be used as the revolution shaft 23, and the revolution shaft 23 is configured to be revolvable about a revolution axis 25 as its axis. At an end portion of the revolution shaft 23 on the side opposite an end portion connected to the wall portion 21$w$, a revolution motor (not shown) for revolving the revolution shaft 23 about the revolution axis 25 is provided. Also, the revolution plate 21 is configured to be movable between a position where the surface of the bottom portion 21$b$ is horizontal and a position where the surface of the bottom portion 21$b$ is vertical. In this embodiment, the revolution plate 21 is configured to be pivotable about a virtual axis 21$a$ passing through a portion of the wall portion 21$w$ located on an extension of the revolution shaft 23 and extending horizontally perpendicular to the revolution axis 25 when in the position where the surface of the bottom portion 21$b$ is horizontal (see FIG. 1A). The UV irradiator 15 and the revolution plate 21 are arranged such that the bottom portion 21$b$ and the main portion 15$f$ of the UV irradiator 15 are in a facing positional relationship with each other when the revolution plate 21 has been moved to the position where the surface of the bottom portion 21$b$ of the revolution plate 21 is vertical (see FIG. 1B).

The rotation plate 31 is a member for rotating the object T along the surface of the bottom portion 21$b$ of the revolution plate 21. The rotation plate 31 is constituted by forming a plate-like member into a size that encompasses the reverse face Tr of the object T. The rotation plate 31 is a plate-like member having a front face 31$s$ and a reverse face 31$r$ that are both formed to be flat. The rotation plate 31 is arranged such that the reverse face 31$r$ faces the surface of the bottom portion 21$b$ of the revolution plate 21. When the coating substance R is applied to the object T, the object T is placed on the front face 31$s$ of the rotation plate 31 with the reverse face Tr of the object T facing it. The rotation plate 31 has a rotation shaft 33, one end of which is attached to the reverse face 31r thereof. The rotation shaft 33 is a rod-like member, and is attached to the rotation plate 31 to extend perpendicular to the reverse face 31r of the rotation plate 31. A solid or hollow cylinder or prismatic column with a polygonal cross-section can be used as the rotation shaft 33, and the rotation shaft 33 is configured to be rotatable about a rotation axis 35 as its axis. The rotation shaft 33 is typically attached to the rotation plate 31 such that the rotation axis 35 (including a virtual line extending from it) passes through the center of gravity of the rotation plate 31 and the center of figure of each of the front face 31s and the reverse face 31r. The rotation shaft 33 extends through the revolution plate 21, and a configuration in which it is supported by a bearing (not shown) at the part of a through hole of the revolution plate 21 is preferred for structural stability. At an end portion of the rotation shaft 33 on the side opposite an end portion connected to the rotation plate 31, a rotation motor (not shown) for rotating the rotation shaft 33 about the rotation axis 35 is provided.

The controller 50 is a device that controls operation of the coating apparatus 1. The controller 50 is electrically connected to the coating device 11 in a wired or wireless fashion, and is configured to be able to control the adjustment of a supply flow rate of the coating substance R to the object T (including a flow rate of 0 in the case where the supply is stopped) and the movement of the coating device 11 in a horizontal direction. Also, the controller 50 is electrically connected to the UV irradiator 15 in a wired or wireless fashion, and is configured to be able to adjust whether or not to allow the UV irradiator 15 to emit ultraviolet rays and the intensity of the ultraviolet rays to be emitted, and to control the movement of the box member 15c. Also, the controller 50 is electrically connected to the revolution plate 21 in a wired or wireless fashion, and is configured to be able to move the revolution plate 21 between the position where the surface of the bottom portion 21b is horizontal (see FIG. 1A) and the position where the surface of the bottom portion 21b is vertical (see FIG. 1B). Also, the controller 50 is electrically connected to each of the revolution motor (not shown) and the spin motor (not shown) in a wired or wireless fashion, and is configured to be able to control the revolution of the revolution shaft 23 about the revolution axis 25 and the rotation of the rotation shaft 33 about the rotation axis 35 separately.

Referring continuously to FIG. 3, a method for manufacturing a target object coated with a coating substance (which is the object T that has been coated with the coating substance R and is hereinafter referred to as "coated object TR") according to an embodiment of the present invention will be described. FIG. 3 is a flowchart, showing a process of manufacturing the coated object TR. While a method for manufacturing the coated object TR using the coating apparatus 1 described in the foregoing (see FIGS. 1A and 1B) will be described as follows, the coated object TR may be manufactured using an apparatus other than the coating apparatus 1. The following description of a method for manufacturing the coated object TR using the coating apparatus 1 also serves as description of the operation of the coating apparatus 1. In the following description, reference is made to FIGS. 1A and 1B and/or FIGS. 2A and 2B as appropriate when mention is made to the configuration of the coating apparatus 1 and/or the object T. In the example described below, the coating substance R is applied uniformly over the entire coating flat surface Tsp and the entire coating edge surfaces Tsc.

Before starting the manufacture of the coated object TR, the controller 50 moves the revolution plate 21 to the position where the surface of the bottom portion 21b is horizontal. In this state, the object T is placed on the front face 31s of the rotation plate 31, which has been made horizontal (S1). The placement of the object T onto the rotation plate 31 may be achieved by a robot hand (not shown) provided in the coating apparatus 1, or may be achieved by a human hand. In either case, the object T is placed on the front face 31s of the rotation plate 31 with the coating surface Ts of the object T facing upward (with the reverse face Tr in contact with the front face 31s of the rotation plate 31). At this time, it is preferred that the object T be placed in a position where the rotation axis 35 (including a virtual line extending from it) passes through the center of gravity of the object T. Also, it is preferred that the revolution axis 25 (including a virtual line extending from it) be parallel to the coating flat surface Tsp. Also, in this embodiment, the revolution axis 25 is away from the object T in the direction of the opposite side of the bottom portion 21b of the revolution plate 21 and faces the coating flat surface Tsp (in this case, the revolution axis 25 is located closer to the coating flat surface Tsp than to the coating edge surfaces Tsc), or is in contact with the coating flat surface Tsp.

Figure 4A:
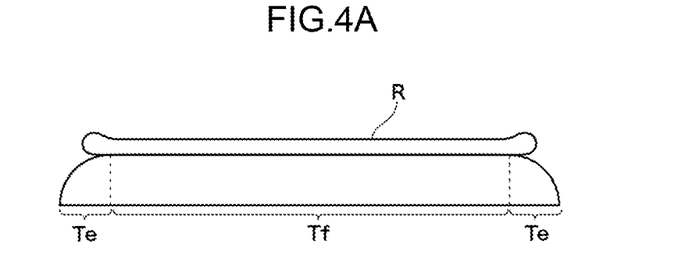
FIG. 4A is a side elevational view of an exemplary state of a coating substance applied to a coating surface, showing a state where puddles of coating substance have reached parts of coating edge surfaces.
Figure 4B:
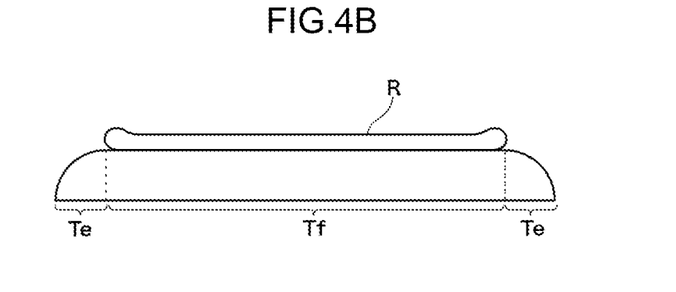
FIG. 4B is a side elevational view of an exemplary state of a coating substance applied to a coating surface, showing a state where puddles of the coating substance are situated within the range of the coating flat surface.

Once the object T is placed on the rotation plate 31, the controller 50 controls the coating device 11 to apply the coating substance R to the coating flat surface Tsp by moving the coating device 11 from one end to the other end of the coating flat surface Tsp along the coating flat surface Tsp at a position immediately above the coating flat surface Tsp while feeding an appropriate amount of the coating substance R from the coating device 11 (coating substance supply step: S2). By applying the coating substance R to the coating flat surface Tsp with the coating device 11 in this manner, it is possible to apply the coating substance R almost uniformly to the entire coating flat surface Tsp in one step. Here, the reason for the expression "almost uniformly" is to take into account the fact that puddles with a larger thickness than other portions are Ruined at both end portions where the application is started and ended when the application of the coating substance R to the coating flat surface Tsp is completed. This application of the coating substance R to the coating surface Ts is one form of wet coating. When the application to the coating flat surface Tsp is completed, the coating substance R on the object T has typically been applied uniformly to the coating flat surface Tsp with puddle portions on the coating edge surfaces Tsc (the edge face portions Te) as shown in FIG. 4A. However, it may be the case, as shown in FIG. 4B, that the entire coating substance R applied including puddles is situated within the range of the coating flat surface Tsp. In this embodiment, since it is difficult to apply the coating substance R uniformly over the entire coating flat surface Tsp and the entire coating edge surfaces Tsc with the coating device 11, the following measure is taken following the coating substance supply step (S2).

Once the application of the coating substance R to the coating flat surface Tsp is completed, the controller 50 retracts the coating device 11 to the opposite side from the revolution shaft 23 and moves the revolution plate 21 to the position where the surface of the bottom portion 21b is vertical (see FIG. 1B). When this movement is completed, the main portion 15f of the UV irradiator 15 is situated at a position facing the coating flat surface Tsp coated with the coating substance R. After that, the controller 50 starts revolving the revolution plate 21 about the revolution axis 25 (S3). When the revolution plate 21 revolves about the revolution axis 25, the puddle portions at both end portions of the coating substance R applied to the coating flat surface Tsp are spread on the coating edge surfaces Tsc in a direction away from the coating flat surface Tsp (a direction toward the rotation plate 31) by a centrifugal force generated by the revolution about the revolution axis 25. At this time, the farther away from the object T the revolution axis 25 is, the better from the standpoint of increasing the centrifugal force exerted on the coating substance R on the coating edge surfaces Tsc, and the closer to the object T it is, the better from the standpoint of preventing an increase in size of the coating apparatus 1. It is, therefore, preferred to set the distance between the revolution axis 25 and the object T by comparing and weighing these. Because the coating substance R is spread on the coating edge surfaces Tsc by a centrifugal force generated by revolution about the revolution axis 25, the coating substance R can be also applied uniformly to the coating edge surfaces Tsc. It should be noted that, at this time, the coating substance R in a liquid form tends to gather at a lower part and the coating substance R on the coating edge surface Tsc at a higher position and the coating substance R on the coating edge surface Tsc at a lower position may have different thicknesses because the coating flat surface Tsp is in a vertical position (a normal line of the coating flat surface Tsp is horizontal), and the centrifugal force generated by revolution about the revolution axis 25 and exerted on the coating surface Ts varies according to the distance from the revolution axis 25, which may lead to unevenness of the spread state of the coating substance R. To avoid these inconveniences, in this embodiment, the controller 50 rotates the rotation plate 31 about the rotation axis 35 as appropriate while revolving the revolution plate 21 about the revolution axis 25 to equalize the effect of gravity as much as possible and to equalize the centrifugal force exerted on the coating surface Ts as much as possible.

The controller 50 causes the UV irradiator 15 to irradiate the coating substance R spread by revolution of the revolution plate 21 about the revolution axis 25 with ultraviolet rays at an appropriate time to increase the viscosity of the coating substance R (viscosity increasing step: S4). Here, the appropriate time is when the thickness of the coating substance R applied to the coating surface Ts becomes a desired thickness (in this embodiment, when the thickness becomes generally equal to the thickness of the coating substance R applied uniformly to the coating flat surface Tsp). The viscosity of the part of the coating substance R to which ultraviolet rays are irradiated is increased according to the intensity and irradiation time of the ultraviolet rays, and, typically and eventually, loses flowability and turns to a gel-like form having elasticity. It is thought that, depending on the perspective, a gel that has lost flowability does not fit the concept of "viscosity." However, in view of the fact that viscosity refers to the degree of stickiness of fluid, the fact that fluid is a collective term for substances that deform continuously according to the magnitude of shear stress and refers to substances exclusively in the form of gases and liquids among the three forms of matter, but sometimes plasmas and solids having plasticity are also included as a form of fluid, and the fact that the distinction between solids and fluids is ambiguous but they can be divided according to the degree of viscosity at any rate, gel is herein construed as a form of liquid having an increased viscosity. It should be noted that, because the coating substance R is sometimes solidified until it loses stickiness completely depending on the conditions required for the coated object TR, increasing the viscosity also includes solidifying until stickiness is lost in this embodiment. The degree to which the viscosity of the coating substance R is increased by ultraviolet irradiation from the UV irradiator 15 is accepted if no flow that causes a change in thickness occurs in the coating substance R. By irradiating the coating substance R applied with ultraviolet rays to increase the viscosity of the coating substance R, it is possible to prevent the coating substance R applied from being changed in thickness by the effect of gravity, centrifugal force or the like and therefore possible to form a film of the coating substance R with a stable thickness. Because the coating substance R near the edge portions of the coating flat surface Tsp is gradually spread in a direction away from the coating flat surface Tsp on the coating edge surfaces Tsc by revolution of the revolution plate 21 about the revolution axis 25 while ultraviolet irradiation from the UV irradiator 15 is being carried out, it is preferred that the end portions 15e of the UV irradiator 15 be initially located at positions deviated from the coating edge surfaces Tsc and then moved to follow the spread of the coating substance R. In this embodiment, the movement speed of the UV irradiator 15 is determined based on the spread speed of the coating substance R that has been previously obtained on the basis of the properties of the coating substance R, the speed of revolution of the revolution plate 21 and so on. It should be noted that in the flowchart in FIG. 3, for the convenience of description, although the ultraviolet irradiation from the UV irradiator 15 (S4) is carried out after the revolution of the revolution plate 21 about the revolution axis 25 is started (S3), when the coating substance R has been uniformly applied to the coating flat surface Tsp as a result of application by the coating device 11 before the revolution plate 21 is revolved, the coating substance R uniformly applied on the coating flat surface Tsp may be irradiated with ultraviolet rays to increase its viscosity before the revolution plate 21 is revolved. Also, when the coating substance R is irradiated with ultraviolet rays from the UV irradiator 15 to increase its viscosity, the intensity, irradiation time and so on of the ultraviolet rays should be appropriately adjusted depending on the type of the coating substance R, the distance between the UV irradiator 15 and the object T and so on.

The controller 50 determines whether the spread of the coating substance R has been completed (S5) during ultraviolet irradiation from the UV irradiator 15. In this embodiment, it is determined that the spread has been completed based on the fact that the entire coating surface Ts of the object T is covered with the coating substance R with a uniform thickness and the viscosity increasing by ultraviolet irradiation is ended. If the spread has not been completed in the step of determining whether the spread of the coating substance R has been completed (S5), the process returns again to the step of determining whether the spread of the coating substance R has been completed (S5). On the other hand, when the spread has been completed, the controller 50 increases the speed of revolution of the revolution plate 21 about the revolution axis 25 (S6) to increase the centrifugal force exerted on the coating edge surfaces Tsc. By increasing the centrifugal force exerted on the coating edge surfaces Tsc, it is possible to blow off and remove excess coating substance R. It should be noted that instead of or in addition to increasing the speed of rotation, the centrifugal force may be increased by increasing the radius of revolution (the distance between the revolution axis 25 and the coating edge surfaces Tsc). After excess coating substance R is removed by increasing the centrifugal force exerted on the coating edge surfaces Tsc, the controller 50 stops the revolution of the revolution plate 21 about the revolution axis 25 (S7). The manufacture of the coated object TR is completed by implementing the above-mentioned steps. In this embodiment, the process from starting the revolution of the revolution plate 21 about the revolution axis 25 (S3) to determining that the spread has been completed in the step of determining whether the spread of the coating substance R has been completed (S5) in the flowchart shown in FIG. 3 corresponds to an edge face portion coating substance adjustment step.

As described above, according to the method for manufacturing a coated object TR according to this embodiment, for the object T having the main flat face portion Tf and the chamfered edge face portions Te, the coating substance R is uniformly and quickly applied at a uniform thickness to the coating flat surface Tsp by the coating device 11 and the coating substance R is applied at a uniform thickness to the coating edge surfaces Tsc by spreading the coating substance R by revolution of the revolution plate 21 about the revolution axis 25. It is, therefore, possible to apply the coating substance R uniformly to the entire coating surface Ts within a relatively short period of time and to reduce the amount of the coating substance R wasted by reducing the amount of the coating substance R treated as an excess portion. Also, because the viscosity of the part of the coating substance R applied uniformly is sequentially increased, it is possible to prevent the coating substance R that has become uniform from being changed in thickness by the centrifugal force generated by revolution of the revolution plate 21.

Figure 5:
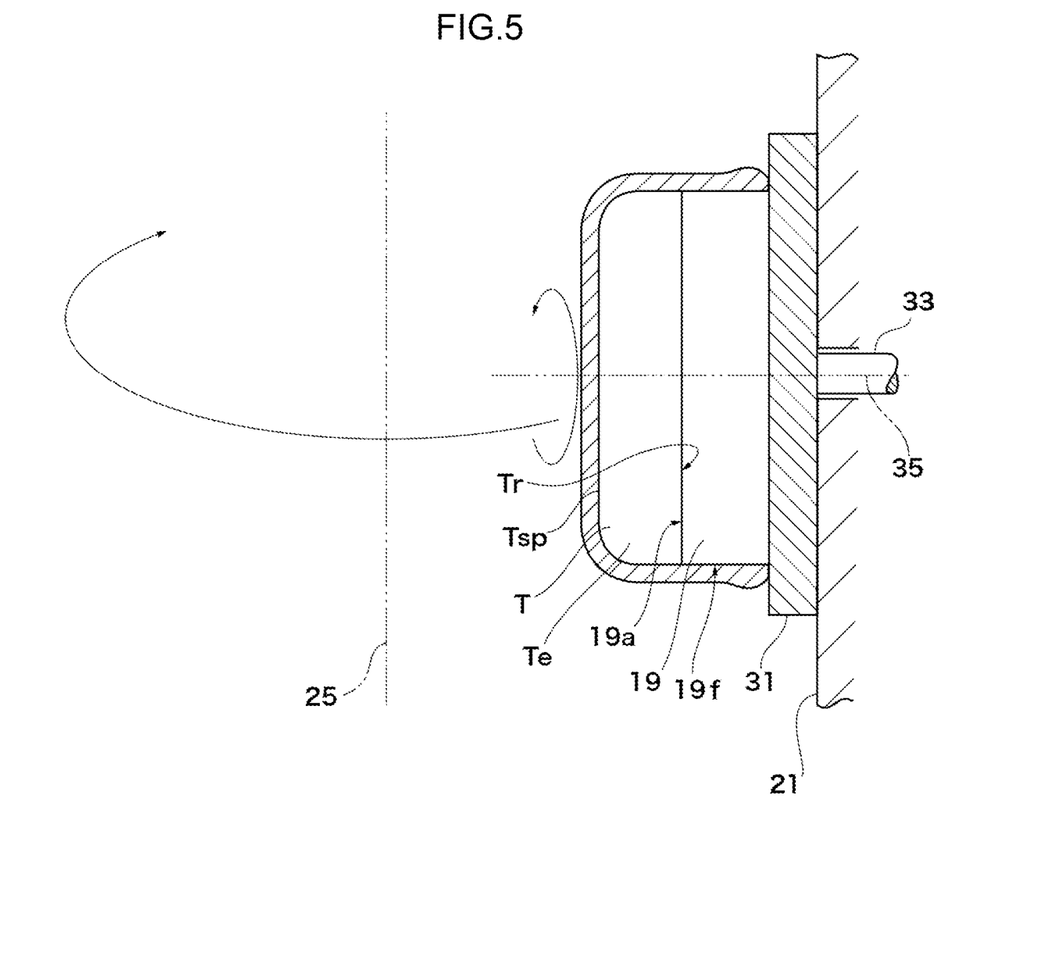
FIG. 5 is a side elevational view of a conceptual diagram, showing an example of an aspect of implementing a method for manufacturing a target object coated with a coating substance according to a first modification of the embodiment of the present invention.

Referring next to FIG. 5, a method for manufacturing a coated object TR according to a first modification is described. In this first modification, a jig 19 is provided between the rotation plate 31 and the object T. The jig 19 has an upper face 19a having the same shape as the reverse face Tr of the object T and connecting faces 19f intersecting with the upper face 19a, and has a predetermined thickness. The connecting faces 19f are formed to be continuous from the coating edge surfaces Tsc of the object T when the jig 19 is attached to the object T with the upper face 19a of the jig 19 mated with the reverse face Tr of the object T. In other words, when the jig 19 is attached to the object T with the upper face 19a mated with the reverse face Tr, the jig 19 and the object T have a smooth contour as a whole. The length of the connecting faces 19f in a direction in which the rotation axis 35 extends when the object T with the jig 19 attached thereto is placed on the front face 31s of the rotation plate 31 corresponds to the predetermined thickness of the jig 19. The predetermined thickness of the jig 19 is preferably greater than the length that the puddles at leading edges of the coating substance R may have when the revolution plate 21 is revolved about the revolution axis 25 to spread the coating substance R, more preferably about 1.5 to 2 times the length of the puddles, and may be greater than twice the length of the puddles. In this modification, in the step of placing the object T on the front face 31s of the rotation plate 31 (S1) in the flowchart shown in FIG. 3, the jig 19 configured as described above is attached to the object T (jig attachment step) and the jig 19 with the object T attached thereto is placed on the front face 31s of the rotation plate 31. As described above, the jig attachment step is carried out before the step of starting revolution of the revolution plate 21 about the revolution axis 25 (S3) in the flowchart shown in FIG. 3, and it is carried out even before the coating substance supply step (S2) in this modification. When the revolution plate 21 is revolved about the revolution axis 25 to spread the coating substance R after the jig 19 is attached to the object T in the above manner as in this modification, the puddles of the coating substance R that are moved on the coating surface Ts by a centrifugal force are transferred from the coating edge surfaces Tsc to the connecting faces 19f of the jig 19. This makes it more certain to apply the coating substance R at a uniform thickness all over the entire the coating edge surfaces Tsc more securely. It should be noted that when the coating substance R can be applied at a desired thickness without increase in the viscosity of the coating substance R, the viscosity increasing step may be omitted.

Referring next to FIGS. 6A to 6C, a method for manufacturing a target object coated with a coating substance according to a second modification will be described. In this second modification, what is manufactured is a stuck member obtained by fitting a cover C onto the object T via the coating substance R. In this stuck member, by covering the object T with the coating substance R applied to the coating surface Ts with the cover C, a layer of the coating substance R with a predetermined thickness is formed between the cover C and the coating surface Ts. The cover C is a member that covers the coating surface Ts of the object T, and corresponds to an overlay member. In this modification, the cover C has an inner face shaped to be larger than the coating surface Ts so that it can cover the entire coating surface Ts. While the inner face of the cover C has a contour generally similar to that of the coating surface Ts of the object T when the cover C has been processed with a high accuracy, the inner face of the cover C may not have a contour similar to that of the coating surface Ts of the object T when the processing accuracy is low (in particular, the curvature of the parts corresponding to the edge face portions Te, or the like). In this modification, it is possible to compensate the machining error of the cover C by filling the space between the object T and the cover C with the coating substance R.

In the method for manufacturing a stuck member according to the second modification shown in FIGS. 6A to 6C, the coating substance R is first supplied to the coating surface Ts of the object T (coating substance supply step) as shown in FIG. 6A. At this step, in this modification, because there is no intention to revolve and/or rotate the object T, there is no need to place the object T on the revolution plate 21 (see FIG. 1A) or the rotation plate 31 (see FIG. 1A). In the coating substance supply step, the coating substance R is typically applied to the coating surface Ts by the coating device 11. The coating substance R is preferably applied uniformly to the coating flat surface Tsp, but the coating substance R may be non-uniformly applied (supplied) to the coating edge surfaces Tsc partially or entirely. Here, the coating substance R being applied uniformly to the coating flat surface Tsp means that it is sufficient that the coating substance R is applied uniformly to such a degree that the product quality of the eventually manufactured stuck member is not adversely affected. Once the coating substance R is applied to the coating surface Ts, the uniform coating substance R applied to the coating flat surface Tsp is irradiated with ultraviolet rays by the UV irradiator 15 as shown in FIG. 6B to increase the viscosity of the coating substance R applied to the coating flat surface Tsp (viscosity increasing step). At this step, it is preferred to protect the coating substance R supplied to the coating edge surfaces Tsc, which has not yet had a desired thickness, from the ultraviolet rays by measures such as the use of masks 15m. This makes it possible to prevent the coating substance R on the coating flat surface Tsp applied uniformly from being changed in thickness and to form a film of the coating substance R with a stable thickness. Then, as shown in FIG. 6C, the object T with the coating substance R supplied to the coating surface Ts and the cover C are brought into a vacuum chamber 41, and the cover C is fitted onto the object T with the coating substance R supplied to the coating surface Ts under vacuum. The degree of vacuum in the vacuum chamber 41 may be such a degree that air bubbles that cause an adverse result are not generated between the object T and the cover C when the cover C is fitted onto the object T. When the cover C is fitted onto the object T with the coating substance R supplied to the coating surface Ts, the gap between the coating surface Ts and the cover C is filled with the coating substance R, and the excess portion of the coating substance R present on the edge face portions Te is moved in the direction in which the cover C is fitted (in a direction away from the coating flat surface Tsp) and flows out from the reverse face Tr side. By fitting the cover C onto the object T, the thickness of the coating substance R present on the flat face portion Tf is secured or fixed at the uniform thickness achieved during the viscosity increasing, and the coating substance R present on the edge face portions Te is adjusted to the predetermined thickness corresponding to the gap between the coating edge surfaces Tsc and the object T. In this modification, covering the object T with the cover C to adjust the coating substance R on the edge face portions Te to the predetermined thickness corresponds to the edge face portion coating substance adjustment step. The predetermined thickness may not be a constant thickness as long as it is an intended thickness. In other words, the predetermined thickness may vary at different locations (either on the flat face portion Tf or on the edge face portions Te). According to this modification, even when the processing accuracy of the cover C is not high, a stuck member having a layer of the coating substance R with a desired thickness can be manufactured. It should be noted that when no problem occurs even if the cover C is fitted onto the object T with the coating substance R applied thereto in a place other than a place in a vacuum environment (typically under atmospheric pressure), there is no need to do it under vacuum. In this case, there is no need to utilize the vacuum chamber 41.

In the above description, the object T is rectangular as seen in a plan view (planar shape). However, the object T may have a polygonal shape such as square, triangle or pentagon, or a circular or ellipsoidal shape.

In the above description, the coating substance R has a property of increase in viscosity when irradiated with ultraviolet rays, and the predetermined viscosity increasing treatment involves irradiating the coating substance R with ultraviolet rays from the UV irradiator 15. However, when the coating substance R is a thermo-setting resin (thermoresponsive resin), the predetermined viscosity increasing treatment may involve heating the coating substance R (with a heater or the like). Alternatively, when the coating substance R has a property of decreasing in viscosity when heated, it is preferred to heat the coating substance R in the areas not irradiated with ultraviolet rays in the step of increasing the speed of revolution of the revolution plate 21 about the revolution axis 25 (S6) in the flow shown in FIG. 3 so that excess coating substance R can be easily blown off.

In the above description, in the process of manufacturing the coated object TR and the process of manufacturing the stuck member (see FIGS. 6A to 6C), a predetermined viscosity increasing treatment, such as ultraviolet irradiation, is performed to prevent the coating substance R applied to the object T from being changed in thickness. However, when no problem occurs in the finished product (target object coated with a coating substance) without the predetermined viscosity increasing treatment, the predetermined viscosity increasing treatment (step S4 in the flow of FIG. 3) can be omitted.

In the above description (except the embodiment shown in FIGS. 6A to 6C), the rotation plate 31 is provided. However, when no unevenness occurs in the coating substance R supplied to the coating surface Ts even if the rotation plate 31 is not rotated about the rotation axis 35, the rotation plate 31 may be omitted.

In the above description (except the embodiment shown FIGS. 6A to 6C), the speed of revolution of the revolution plate 21 about the revolution axis 25 is increased to blow off and remove the coating substance R (S6) when the spread of the coating substance R on the coating edge surfaces Tsc is completed. However, when no problem occurs even if the coating substance R is not blown off, the step of increasing the speed of revolution of the revolution plate 21 about the revolution axis 25 (S6) may be omitted.

In the above description, the object T has a convex shape as a whole in which the coating flat surface Tsp is situated at the highest position with respect to the reverse face Tr. However, the object T may have a concave shape in which the coating flat surface Tsp is formed in a concave position and the coating edge surfaces Tsc are formed on inner walls erected toward a position raised from the coating flat surface Tsp (a position away from the reverse face Tr) to surround the coating flat surface Tsp. In this case, it is necessary that the revolution axis 25 is provided at such a position that a centrifugal force by which the coating substance R is moved in a direction along the coating edge surfaces Tsc can be generated by revolving the object T about the revolution axis 25. Moreover, when the coating substance R on the coating edge surfaces Tsc is moved in a direction away from the coating flat surface Tsp, the revolution axis 25 is preferably located on the opposite side from the coating edge surfaces Tsc with respect to the coating flat surface Tsp, and is typically set at any one of a position near the coating flat surface Tsp (a position in contact with the coating flat surface Tsp or a position slightly away from the coating flat surface Tsp toward the coating edge surfaces Tsc), a position between the coating flat surface Tsp and the reverse face Tr, a position in contact with the reverse face Tr, or a position away from the object T with respect to the reverse face Tr. It should be noted that when the object T has a concave shape, the position of the revolution axis 25 may be set such that the coating substance R being moved along the coating edge surface Tsc by revolution of the object T about the revolution axis 25 is moved in a direction toward the coating flat surface Tsp.

In the above description, the method for manufacturing the target object coated with a coating substance according to an embodiment of the present invention is described as one example referring to the drawings. However, the configurations, structures, numbers, arrangements, shapes, materials and so on of each part of the method for manufacturing and the object and so on are not limited to the above specific examples, and those preferentially employed by those skilled in the art as appropriate are also embraced within the scope of the present invention as long as they cover the gist of the present invention.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

DESCRIPTION OF REFERENCE NUMERALS AND SYMBOLS 1 coating apparatus
11 coating device
15 UV irradiator
19 jig
19f connecting face
21 revolution plate
25 revolution axis
31 rotation plate
35 rotation axis
41 vacuum chamber
50 controller
C cover
R coating substance
T object
Te edge face portion
Tf flat face portion
Tsc coating edge surface
Tsp coating flat surface

The invention claimed is:

1. A method for manufacturing a target object coated with a coating substance, the target object including a flat face portion and an edge face portion continuous from the flat face portion, the flat face portion including a coating flat surface formed thereon which has a flat face, the edge face portion including a coating edge surface formed thereon, the coating edge surface including at least one of a curved surface or a flat surface that is not parallel to the coating flat surface of the flat face portion, and a coating substance being coated on the coating flat surface and the coating edge surface, the method comprising:
   a coating substance supply step of supplying the coating substance along at least the coating flat surface; and
   an edge face portion coating substance adjustment step of adjusting the coating substance supplied to the coating edge surface, or the coating substance, which is moved from the coating flat surface, to cover the coating edge surface at a predetermined thickness,
   wherein the edge face portion coating substance adjustment step comprises spreading the coating substance by revolving the target object about a revolution axis not passing through the target object.

2. The method for manufacturing a target object coated with a coating substance according to claim 1, wherein the revolution axis is an axis of revolution about which the target object is revolved to generate a centrifugal force that moves the coating substance in a direction away from the coating flat surface along the coating edge surface.

3. The method for manufacturing a target object coated with a coating substance according to claim 2, further comprising, before the edge face portion coating substance adjustment step, a jig attachment step of attaching a jig to the target object on a downstream side of the direction in which the coating substance is moved by the centrifugal force with respect to the coating flat surface, the jig including a connecting face that forms a surface smoothly continuous from the coating edge surface when attached to the target object;
   wherein the edge face portion coating substance adjustment step further comprises spreading the coating substance until the coating substance reaches the connecting face beyond the coating edge surface by revolution of the target object about the revolution axis.

4. The method for manufacturing a target object coated with a coating substance according to claim 3, wherein:
   the coating substance comprises a liquid substance that increases in viscosity when subjected to a predetermined viscosity increasing treatment; and
   the edge face portion coating substance adjustment step further comprises a viscosity increasing step of subjecting the coating substance, which has been adjusted to the predetermined thickness, to the predetermined viscosity increasing treatment.

5. The method for manufacturing a target object coated with a coating substance according to claim 2, wherein:
   the coating substance comprises a liquid substance that increases in viscosity when subjected to a predetermined viscosity increasing treatment; and
   the edge face portion coating substance adjustment step further comprises a viscosity increasing step of subjecting the coating substance, which has been adjusted to the predetermined thickness, to the predetermined viscosity increasing treatment.

6. The method for manufacturing a target object coated with a coating substance according to claim 1, wherein:
   the coating substance comprises a liquid substance that increases in viscosity when subjected to a predetermined viscosity increasing treatment; and
   the edge face portion coating substance adjustment step further comprises a viscosity increasing step of subjecting the coating substance, which has been adjusted to the predetermined thickness, to the predetermined viscosity increasing treatment.

7. The method for manufacturing a target object coated with a coating substance according to claim 1, wherein the revolution axis extends parallel to the coating flat surface.

8. The method for manufacturing a target object coated with a coating substance according to claim 1, wherein, in the edge face portion coating substance adjustment step, spreading the coating substance by revolving the target object about a revolution axis is performed after the coating substance supply step and before starting a rotation of the target object about a rotation axis passing through the target object.

9. The method for manufacturing a target object coated with a coating substance according to claim 1, wherein, in the edge face portion coating substance adjustment step, spreading the coating substance by revolving the target object about a revolution axis is performed without a rotation of the target object about a rotation axis passing through the target object.

10. A method for manufacturing a target object coated with a coating substance, the target object including a flat face portion and an edge face portion continuous from the flat face portion, the flat face portion including a coating flat surface formed thereon which has a flat face, the edge face portion including a coating edge surface formed thereon, the coating edge surface including at least one of a curved surface or a flat surface that is not parallel to the coating flat surface of the flat face portion, and a coating substance being coated on the coating flat surface and the coating edge surface, the method comprising:
- a coating substance supply step of supplying the coating substance along at least the coating flat surface; and
- an edge face portion coating substance adjustment step of adjusting the coating substance supplied to the coating edge surface, or the coating substance, which is moved from the coating flat surface, to cover the coating edge surface at a predetermined thickness,
- wherein the edge face portion coating substance adjustment step comprises fitting an overlay member, for covering the coating flat surface and the coating edge surface, onto the target object to adjust the coating substance filled between the target object and the overlay member to a predetermined thickness.

* * * * *